United States Patent [19]

Matsumoto et al.

[11] Patent Number: 5,311,471
[45] Date of Patent: May 10, 1994

[54] SEMICONDUCTOR MEMORY DEVICE

[75] Inventors: Naoki Matsumoto, Tokyo; Yuji Wtanabe, Kawasaki; Shigeo Ohshima, Yokohama, all of Japan

[73] Assignee: Kabushiki Kaisha Toshiba, Kawasaki, Japan

[21] Appl. No.: 987,543

[22] Filed: Dec. 7, 1992

Related U.S. Application Data

[63] Continuation of Ser. No. 865,740, Apr. 8, 1992, abandoned, which is a continuation of Ser. No. 618,491, Nov. 27, 1990, abandoned.

[30] Foreign Application Priority Data

Nov. 27, 1989 [JP] Japan .................................. 1-307228

[51] Int. Cl.⁵ .............................................. G11C 7/00
[52] U.S. Cl. ............................... 365/189.05; 365/190; 365/203; 365/205; 365/208; 365/233
[58] Field of Search ................... 365/189.05, 190, 203, 365/207, 208, 205, 233

[56] References Cited

U.S. PATENT DOCUMENTS

| | | | |
|---|---|---|---|
| 4,575,824 | 3/1986 | Tanaka et al. | 365/189.05 |
| 4,685,088 | 8/1987 | Iannucci | 365/189.05 |
| 4,764,899 | 8/1988 | Lewallen et al. | 365/189 |
| 4,817,054 | 3/1989 | Banerjee | 365/189 |
| 4,849,937 | 7/1989 | Yoshimoto | 365/189.05 |
| 4,855,957 | 8/1989 | Nogami | 365/189.05 |
| 5,010,522 | 4/1991 | Ashmore | 365/189.05 |
| 5,043,944 | 8/1991 | Nakamura et al. | 365/190 |
| 5,073,872 | 12/1991 | Masuda et al. | 365/189.05 |

FOREIGN PATENT DOCUMENTS 0317012 5/1989 European Pat. Off.

Primary Examiner—Joseph E. Clawson, Jr.
Attorney, Agent, or Firm—Foley & Lardner

[57] ABSTRACT

A semiconductor memory device including:
a data storage device having a plurality of memory cells each capable of storing a data and being selected by an address, first complementary data corresponding to the data in a selected memory cell being outputted to first complementary data lines;
a first equalizer for short-circuiting and equalizing the first complementary data lines;
an amplifier for receiving the first complementary data from the first complementary data lines, making large the difference between levels of the first complementary data, and outputting as second complementary data the levels to second complementary data lines;
a second equalizer for short-circuiting and equalizing the second complementary data lines;
a data latch circuit having latch units and switching means, the latch unit receiving and latching the second complementary data from the second complementary data lines and outputting as third complementary data the second complementary data to third complementary data lines, the switching unit connecting/disconnecting the second complementary data lines, and the switching unit being serially connected to the second complementary data lines between the second equalizer and the latch units; and
an output unit for receiving the third complementary data from the third complementary data lines and outputting an output signal corresponding to the third complementary data.

9 Claims, 3 Drawing Sheets

SEMICONDUCTOR MEMORY DEVICE

This application is a continuation of application Ser. No. 07/865,740, filed Apr. 8, 1992, now abandoned, which is a continuation of application Ser. No. 07/618,491, filed Nov. 27, 1990, now abandoned.

FIELD OF THE INVENTION

The present invention relates to a semiconductor memory device, and more particularly to a semiconductor memory device of the type in which high speed data access is carried out at a high speed cycle time.

BACKGROUND OF THE INVENTION

For memories such as static random access memories (RAM) and multi-port memories of the type in which high speed data accesses are carried out sequentially at high speed cycle time, it is necessary to execute a series of data reading operations as fast as possible. A series of data reading operations by such memories includes the following operations. Namely, memory cells or data registers are selected. The data read therefrom are outputted to a common data bus pair (DQ line pair) and amplified by sense amplifiers at several stages to MOS logic levels. The amplified data are supplied to a common data output buffer and outputted to an external output pin as a "0" level data or a "1" level data. Such a series of operations is required to be carried out at high speed.

FIG. 1 is a block diagram showing a semiconductor integrated circuit according to a background art. As shown in FIG. 1, complementary data read from data storage means M such as a memory cell are outputted onto a pair of data busses DQ and $\overline{DQ}$ (DQ line pair). The data on the DQ line pair are amplified by a sense amplifier A to a power supply potential level $V_{CC}$ and to a ground potential level $V_{SS}$, respectively, and outputted onto a RD line pair of RD and $\overline{RD}$. In accordance with a pair of data on the RD line pair, a "1" level signal or a "0" level signal is outputted to an external output pin I/O via a data output buffer C.

In FIG. 1, Te1 and Te2 represent equalizing transistors which equalize the DQ line pair and RD line pair, respectively.

The circuit constructed as above operates in the manner shown in the timing chart of FIG. 2. In FIG. 2, FIG. 2(A) shows a cycle signal SC which indicates a data read cycle for reading a data from a memory, FIG. 2(B) shows a signal on the DQ line pair inputted to the sense amplifier A, FIG. 2(C) shows a signal on the RD line pair inputted from the sense amplifier A to the data output buffer C, and FIG. 2(D) shows a signal outputted from the data output buffer C to the external output pin I/O.

The data read from a memory cell or the like appear at the DQ line pair at time t1. The read-out data are supplied to and amplified by the sense amplifier A to the power supply potential level $V_{CC}$ and to a ground potential level $V_{SS}$, i.e., to MOS logic levels. Thereafter, at time t2 the amplified signals are outputted from the sense amplifier A onto the RD line pair. In response to a change of the cycle signal SC at time t3, the data output buffer C latches the data on the RD line pair at time t4 and outputs the data to the external output pin I/O.

The above operations are repeated to sequentially read data from different memory cells. After the data from a memory cell or the like (data on the RD line pair) are loaded in the data output buffer C, the DQ line pair and RD line pair are equalized at time t5 before the next data are read from a memory cell.

The semiconductor integrated circuit according to the background art operates in the above-described manner. It is therefore possible to read information in a memory cell or data register and output the information onto the DQ line pair at high speed. However, the sense amplifier A must continue to latch the data on the RD line pair while the data on the RD line are being transferred to the data output buffer C.

As described above, after the data on the RD line pair were loaded in the data output buffer C, the DQ line pair and RD line pair are equalized and thereafter, the data on the DQ line pair for the next cycle are sensed and amplified by the sense amplifier A and outputted onto the RD line pair. In this case, however, as the cycle time becomes shorter, it becomes difficult to complete the equalization of the DQ line pair before the next cycle data are read, resulting in a residual hysteresis which causes a high possibility of a read error at the next cycle.

Particularly in the case where an access address for the next cycle has been already determined as in the case of a serial port of a multi-port memory, high speed data access and high speed cycle time depend on the time from the start of data latch on the RD line pair by the sense amplifier to the end of equalizing the DQ line pair.

In order to realize high speed data access and high speed cycle time of the operation of the circuit according to the background art, the amplitudes of signals on the RD line pair may be made large. To this end, it becomes necessary to make the driving power of the sense amplifier A large. Accordingly, power consumption increases, and moreover a logic level inputted from the external is likely to be detected erroneously because of power source noises.

SUMMARY OF THE INVENTION

The present invention has been made in consideration of the above problems. It is an object of the present invention to provide a semiconductor integrated circuit capable of high speed data access at high speed cycle time.

The above object of this invention can be achieved by the provision of a semiconductor memory device comprising:

data storage means (M) having a plurality of memory cells (MC) each capable of storing a data and being selected by an address (Ai), first complementary data corresponding to the data in a selected memory cell being outputted to first complementary data lines (DQ, $\overline{DQ}$);

first equalizing means (Te1) for short-circuiting and equalizing the first complementary data lines (DQ, $\overline{DQ}$);

amplifying means (A) for receiving the first complementary data from the first complementary data lines (DQ, $\overline{DQ}$), making large the difference between levels of the first complementary data, and outputting as second complementary data the levels to second complementary data lines (RD1, $\overline{RD1}$);

second equalizing means (Te2) for short-circuiting and equalizing the second complementary data lines (RD1, $\overline{RD1}$);

data latching means (B) having latch means (DH1, DH2) and switching means (IB1, IB2), the latch means receiving and latching the second complementary data from the second complementary data lines (RD1, $\overline{RD1}$) and outputting as third complementary data the second complementary data to third complementary data lines (RD2, $\overline{RD2}$), the switching means connecting/disconnecting the second complementary data lines (RD1, $\overline{RD1}$), and the switching means being serially connected to the second complementary data lines (RD1, $\overline{RD1}$) between the second equalizing means (Te2) and the latch means (DH1, $\overline{DH2}$); and output means (C) for receiving the third complementary data from the third complementary data lines (RD2, $\overline{RD2}$) and outputting an output signal corresponding to the third complementary data.

DESCRIPTION OF THE PREFERRED EMBODIMENT

An embodiment of this invention will be described with reference to the accompanying drawings.

Figure 1:
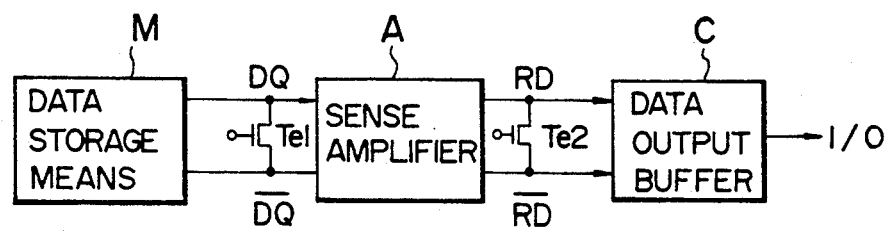
FIG. 1 is a block diagram showing a semiconductor integrated circuit according to a background art.
Figure 2:
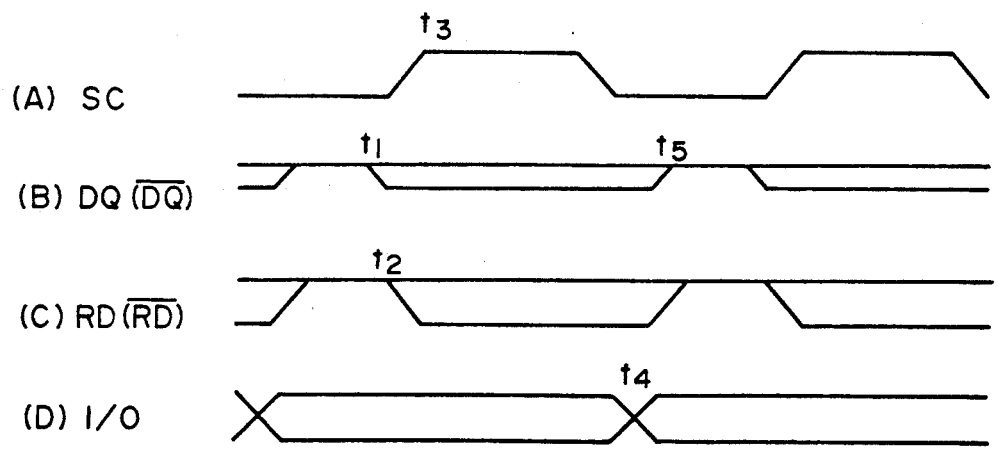
FIG. 2 is a timing chart used for explaining the operation of the circuit shown in FIG. 1.
Figure 3:
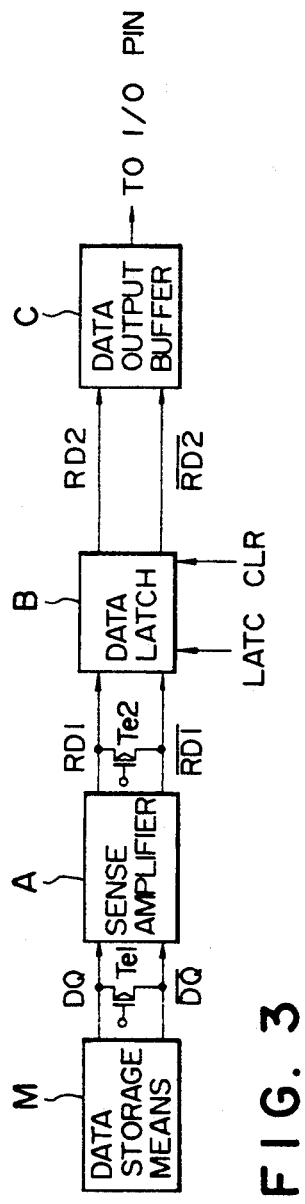
FIG. 3 is a block diagram showing an embodiment of this invention.

FIG. 3 is a block diagram showing an embodiment of this invention. Referring to FIG. 3, a first RD line pair (RD1, $\overline{RD1}$) at the output side of a sense amplifier A is connected to a data latch circuit B. To the data latch circuit B, there are supplied two control signals LATC and CLR. A second RD line pair (RD2, $\overline{RD2}$) at the output side of the data latch circuit B is connected to a data output buffer C. The other circuit structure is the same as that shown in FIG. 1.

Figure 4:
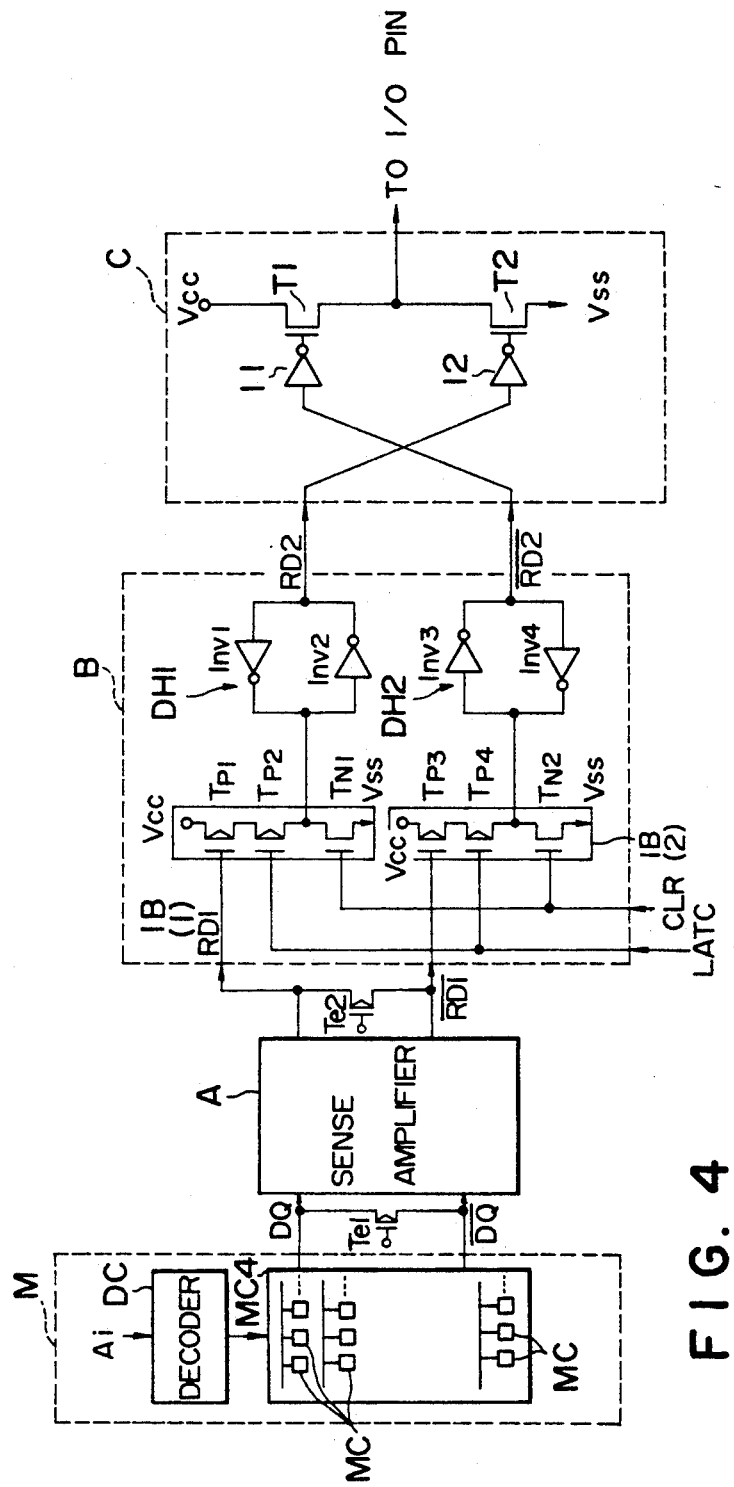
FIG. 4 shows an example of the detailed circuit shown in FIG. 3.

FIG. 4 is a detailed circuit diagram showing an example of the data latch circuit B shown in FIG. 3. In FIG. 4, a circuit having a memory cell array MCA is shown as data storage means M. This circuit also has a decoder DC to which an address Ai is supplied. The decoder DC decodes the address Ai to select one memory cell MC of the memory cell array MCA. Complementary signals corresponding to the data in the selected memory cell are supplied to the sense amplifier A via the DQ line pair. Signals on the first RD line pair outputted from the sense amplifier A are applied to the gates of P-type transistors $T_{p1}$ and $T_{p3}$ of an input buffer IB. A signal from the transistor $T_{p1}$ passes through a P-type transistor $T_{p2}$, the gate of which is supplied with the latch signal LATCH, and is supplied to a data holding circuit DH1 constructed of inverse-and-parallel connected inverters Inv1 and Inv2. On the other hand, a signal from the transistor $T_{p3}$ passes through a P-type transistor $T_{p4}$, the gate of which is supplied with the latch signal LATCH, and is supplied to a data holding circuit DH2 constructed of inverse-and-parallel connected inverters Inv3 and Inv4. The outputs of the data holding circuits DH1 and DH2 are supplied to the second RD line pair (RD2, $\overline{RD2}$).

Signals on the first RD line pair are sampled by the data holding circuits DH1 and DH2 while the latch signal LATC takes a "0" level. While the latch signal LATC takes a "1" level, the signals on the first RD line pair latched at the preceding cycle and held by the data latch circuits DH1 and DH2 are outputted onto the second RD line pair.

N-type transistors $T_{N1}$ and $T_{N2}$ to which gates the clear signal CLR are inputted, are Serially connected to the P-type transistors $T_{p2}$ and $T_{p4}$ respectively. The other terminals of the transistors $T_{N1}$ and $T_{N2}$ are connected to the ground potential $V_{SS}$ terminal. The transistors $T_{N1}$ and $T_{N2}$ are provided for canceling data hysteresis for the operation of the next cycle. Namely, the transistors $T_{N1}$ and $T_{N2}$ are supplied with the clear signal CLR immediately before outputting data so that the second RD line pair (RD2, $\overline{RD2}$) is pre-charged to the "H" level.

The data output buffer C at the next stage is constructed of N-type transistors T1 and T2 which are serially connected between the power source potential $V_{CC}$ and ground potential $V_{SS}$. The gates of the transistors T1 and T2 are connected via respective inverters I1 and I2 to the output terminals ($\overline{RD2}$, RD2) of the data holding circuit DH2 and DH1.

Figure 5:
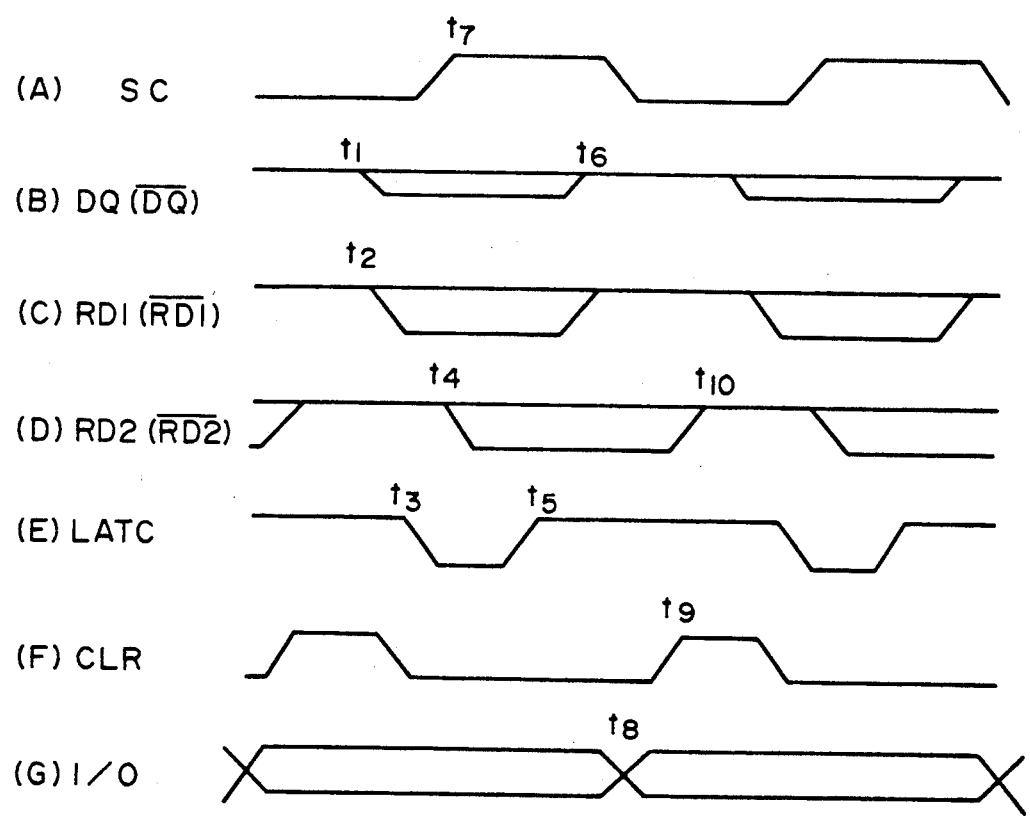
FIG. 5 is a timing chart used for explaining the operation of the circuit shown in FIG. 3.

The operation of the circuit shown in FIG. 4 will be described with reference to the flow chart shown in FIG. 5. FIG. 5 shows signal waveforms at various points of the circuit shown in FIG. 4. FIG. 5(A) shows a cycle signal SC which indicates a data read cycle for reading a data from a memory cell, FIG. 5(B) shows a signal on the DQ line pair inputted to the sense amplifier A, FIG. 5(C) shows a signal on the first RD line pair inputted from the sense amplifier A to the data latch circuit B, FIG. 5(D) shows a signal on the second RD line pair outputted from the data latch circuit B to the data output buffer C, FIG. 5(E) shows the latch signal LATC supplied to the data latch circuit B, FIG. 5(F) shows the clear signal CLR supplied to the data latch circuit B, and FIG. 5(G) shows a signal outputted from the data output buffer C to the external output pin I/O.

The data read from a memory cell MC appear at the DQ line pair at time t1. The read-out data are supplied to and amplified by the sense amplifier A to the power source potential level $V_{CC}$ and ground potential level $V_{SS}$, i.e., to MOS logic levels. Thereafter, at time t2 the amplified signals are supplied to the first RD line pair.

The latch signal LATC takes an "H" level at time t2 so that the data on the first RD line pair are blocked by the data latch circuit B and do not appear at the second RD line pair. Thereafter, the latch signal LATC takes an "L" level at time .t3 so that the data latch circuit B becomes through so that the data on the first RD line pair appear at the second RD line pair at time t4. Thereafter, at time t5 the latch signal LATC takes the "H" level so that the data latch circuit B enters a latch state and the data on the first RD line pair are latched and the data on the second RD line pair are maintained unchanged. Thereafter, at time t6, the DQ line pair and first RD line pair are equalized, this equalization not influence the second RD line pair. At time t8, the data on the second RD line pair are latched by the data output buffer C and outputted to the external output pin I/O.

The clear signal CLR inputted at time t9 causes the N-type transistors $T_{N1}$ and $T_{N2}$ to turn on so that the inverters Inv2 and Inv3 are turned on and the second RD line pair is pre-charged to the "H" level at time t10. In other words, after the data output buffer C latches the output data to the I/O pin, the second RD line pair is pre-charged to the "H" level so that the hysteresis at the previous cycle can be removed.

As described so far, according to the embodiment of this invention, a latch circuit for latching the sensed data from a register or memory cell is provided between a sense amplifier and a data output buffer. Therefore, immediately after the sense amplifier senses the data on the DQ line pair, data transfer to the data output buffer and equalization of the DQ line pair can be executed in parallel at the same time. Accordingly, there is solved the problem wherein high speed data access and high speed cycle time for a serial port of a multi-port memory depend on the time required from the start of latching data on the RD line pair to the end of equalizing the DQ line pair. High speed data access and cycle time can therefore be realized, while reducing power consumption and power supply noises. In other words, the operation of outputting the data latched by the latch circuit can be executed at the same time when the data lines at the output/input sides of an amplifier are equalized for outputting the next data, thereby realizing high speed data output.

What is claimed is:

1. A semiconductor memory device comprising:
    a plurality of memory cells for storing data, each cell being individually addressable for the output of data to a first pair of complementary data lines;
    first equalizing means for equalizing said first pair of complementary data lines by short-circuiting said first pair;
    sense amplifying means for receiving data over said first pair of complementary data lines, amplifying said received data and outputting said amplified data to a second pair of complementary data lines;
    second equalizing means for equalizing said second pair of complementary data lines by short-circuiting said second pair;
    data latching means for latching said amplified data and outputting said amplified and latched data to a third pair of complementary data lines;
    data output buffer means for receiving said data via said third pair of complementary data lines; and
    switching means for controlling the outputs of said latching means to said third pair of complementary data lines, wherein,
    data transfer to the data output buffer and equalization of the first and second pairs of complementary data lines occur simultaneously.

2. The semiconductor memory device as claimed in claim 1, wherein the switching means is connected in series between said second pair of complementary data lines and said latching means.

3. The semiconductor memory device as claimed in claim 2, wherein said switching means sets the outputs of said latching means at either a high level or a low level before reading data out from said memory cell.

4. The semiconductor memory device as claimed in claim 3, wherein said switching means sets the outputs of said latching means at a high level.

5. The semiconductor memory device as claimed in claim 3, wherein each of said switching means comprises first and second switches, said first switch connecting/disconnecting said sense amplifying means and said data latching means, and said second switch connecting/disconnecting the inputs of said data latching means and the ground in response to a control signal.

6. The semiconductor memory device as claimed in claim 5, wherein said second switch is a signal transistor.

7. The semiconductor memory device as claimed in claim 6, wherein each of said data latching means is constructed of inverse-and-parallel connected invertors and outputs an inverted input signal.

8. The semiconductor memory device as claimed in claim 7, wherein said data are amplified by the sense amplifying means to a level equal to a power source potential level and a ground potential level, respectively.

9. The semiconductor memory device as claimed in claim 7, wherein said first and second equalizing means are semiconductor devices connected across said first and second pairs of complementary data lines, respectively.

* * * * *